United States Patent
Ogawa et al.

(10) Patent No.: US 7,663,885 B2
(45) Date of Patent: Feb. 16, 2010

(54) IC FIXING STRUCTURE

(75) Inventors: Takahiro Ogawa, Daito (JP); Takahito Yamanaka, Daito (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 15 days.

(21) Appl. No.: 12/074,158

(22) Filed: Feb. 29, 2008

(65) Prior Publication Data
US 2008/0218978 A1   Sep. 11, 2008

(30) Foreign Application Priority Data
Mar. 6, 2007   (JP) .............................. 2007-056383

(51) Int. Cl.
H05K 7/20   (2006.01)
(52) U.S. Cl. ...................... 361/711; 361/704; 165/80.3; 257/713
(58) Field of Classification Search ......... 361/702–712, 361/714–722, 802, 803; 257/713, 715, 718–719, 257/675, 796; 174/15.1, 16.3, 252, 260; 165/80.2, 80.3, 80.4, 104.33, 104.34, 185; 24/295, 458, 573, 625, 292, 293, 530, 531, 24/568, 570; 411/477, 522, 516, 520
See application file for complete search history.

(56) References Cited

U.S. PATENT DOCUMENTS

| | | | | |
|---|---|---|---|---|
| 3,548,927 A | * | 12/1970 | Spurling | .................... 165/80.3 |
| 3,786,317 A | * | 1/1974 | Thierfelder | .................. 257/775 |
| 5,019,942 A | * | 5/1991 | Clemens | ...................... 361/709 |
| 5,450,284 A | * | 9/1995 | Wekell | ......................... 361/710 |
| 5,844,312 A | * | 12/1998 | Hinshaw et al. | ............. 257/718 |
| 6,079,486 A | * | 6/2000 | Cennamo et al. | ............ 165/80.3 |
| 6,587,344 B1 | * | 7/2003 | Ross | ........................... 361/704 |
| 7,206,204 B2 | * | 4/2007 | Nakatsu et al. | .............. 361/703 |
| 7,360,586 B2 | * | 4/2008 | Mania et al. | ................. 165/185 |

FOREIGN PATENT DOCUMENTS

| | | | | |
|---|---|---|---|---|
| JP | 03082063 | A | * | 4/1991 |
| JP | 2000-323876 | | | 11/2000 |
| JP | 2001-352024 | | | 12/2001 |
| JP | 02003031987 | A | * | 1/2003 |

* cited by examiner

*Primary Examiner*—Michael V Datskovskiy
(74) *Attorney, Agent, or Firm*—Yokoi & Co., U.S.A., Inc.; Petr Ganjian

(57) ABSTRACT

The IC fixing component includes a locking case accommodating the IC in such a manner that a side of the IC out of a face-to-face contact with the heat dissipation plate is brought into a face-to-face contact with the locking case so as to be covered and a through hole and a rotation stop protrusion inserted into a rotation limiting hole. After the IC has been accommodated in the locking case, the screw member inserted through the through hole is screwed into a screw hole of the heat dissipation plate so that the side of the IC out of face-to-face contact with the locking case is pressed by the locking case thereby to be brought into a face-to-face contact with the heat dissipation plate.

4 Claims, 4 Drawing Sheets

IC FIXING STRUCTURE

CROSS-REFERENCES TO RELATED APPLICATIONS

The present application is related to the Japanese Patent Application No. 2007-56383, filed on Mar. 6, 2007, the entire disclosure of which is expressly incorporated by reference herein.

BACKGROUND OF THE INVENTION (1) Field of the Invention

The present invention relates to an IC fixing structure for fixing an integrated circuit (IC) to a heat dissipation plate, and more particularly to such an IC fixing structure for fixing an IC having no fixing part.

(2) Description of the Related Art

Semiconductor devices such as integrated circuits (ICs) are conventionally fixed in a face-to-face contact with a heat dissipation plate so that heat is effectively radiated. For this purpose, some ICs are provided with fixing parts which are to be fixed to radiating plates, respectively. The fixing part includes a screw hole through which a screw is inserted, for example. However, other ICs are not provided with such fixing parts as described above for the purpose of cost reduction. The ICs without fixing parts cannot be brought into a direct face-to-face contact with a heat dissipation plate.

JP-A-2000-352024 discloses a heat dissipation plate to which an IC with no fixing parts is fixed. The heat dissipation plate includes a pressing part which links to a part of the heat dissipation plate at a bent part. A semiconductor device (IC) is inserted between the pressing part and the heat dissipation plate, and the pressing part is fastened up using a screw, whereby the semiconductor device is fixed.

Furthermore, JP-A-2001-352024 discloses a structure for mounting a semiconductor device on a heat dissipation plate although not being related to fixing an IC to a heat dissipation plate. More specifically, the heat dissipation plate is bent so as to have a generally C-shaped section. Both end faces of the heat dissipation plate are bent thereby to be formed into semiconductor device locking parts. A semiconductor device is held between the heat dissipation plate and the semiconductor device locking parts, thereby being fixed.

The heat dissipation plate disclosed in JP-A-2000-352024 has the following problem. That is, the heat dissipation plate cannot position the semiconductor device reliably. Accordingly, when mounted on a substrate, the IC moves within the heat dissipation plate, which movement renders the mounting of the IC difficult.

Furthermore, the mounting structure disclosed in JP-A-2001-352024 has the following problem. That is, the heat dissipation plate needs to be processed. As a result, a semiconductor device cannot be mounted on a ready-made radiator plate such as a heat dissipation plate.

BRIEF SUMMARY OF THE INVENTION

The present invention discloses to provide an IC fixing structure which can reliably position the IC when the IC with no fixing parts is fixed to a ready-made heat dissipation plate.

One aspect of the present invention provides an Integrated Circuit (IC) fixing structure fixing an IC with no fixing part on a heat dissipation plate using an IC fixing component, comprising: the IC fixing component having a locking case accommodating the IC so that a side of the IC that is out of face-to-face contact with the heat dissipation plate is brought into face-to-face contact with the locking case so to be covered; and a fixing part having a through hole through which a screw member is inserted; and after the IC has been accommodated in the locking case, the IC fixing component is screwed to the heat dissipation plate using the through hole so that the side of the IC out of face-to-face contact with the locking case is pressed by a lower edge of the locking case thereby brought into face-to-face contact with the heat dissipation plate.

According to the above-described structure, the IC fixing component is accommodated in the locking case while being brought into a face-to-face contact with the locking case so that a side of the IC fixing component which is out of a face-to-face contact with the heat dissipation plate is covered. The IC fixing component is then screwed to the heat dissipation plate using the screw member having passed through the through hole. Thus, the locking case is screwed to the heat dissipation plate after the IC has been accommodated in the locking case. The side of the IC which is out of a face-to-face contact with the locking case is brought into a face-to-face contact with the heat dissipation plate and thereafter, the IC is fixed. Consequently, even when having no fixing part, the IC can reliably be positioned and fixed to an existing heat dissipation plate.

In one embodiment, the heat dissipation plate has a rotation limiting hole, and the fixing part has a rotation stop protrusion which is inserted into the rotation limiting hole when screwed to the heat dissipation plate.

Rotation of the IC fixing component is limited by the rotation stop protrusion. Consequently, the IC fixing component can easily be fixed to the heat dissipation plate.

An optional aspect of the present invention provides the locking case has a side opposed to the side of the IC which is out of the face-to-face contact with the heat dissipation plate, said side of the locking case having an inwardly inclined lower edge, and the IC is pressed by the lower edge of the side of the locking case.

The IC accommodated in the locking case is pressed to the heat dissipation plate side by the lower edge of the locking case. Consequently, heat dissipation of the IC can be improved by a simple construction.

An optional aspect of the present invention provides the locking case has a side opposed to the side of the IC which is out of the face-to-face contact with the heat dissipation plate, said side of the locking case being bent so as to form a step inside, and the IC is pressed by the step.

The IC accommodated in the locking case is brought into a face-to-face contact with the step thereby to be held. In this case, too, heat dissipation of the IC can be improved by a simple construction.

Another optional aspect of the present invention provides the IC fixing component comprises a plurality of ICs arranged in parallel, and the locking case has a cut-and-raised piece which is formed on a side thereof opposed to the side of each IC out of the face-to-face contact with the heat dissipation plate, the cut-and-raised piece being provided for positioning the ICs.

Even when a plurality of ICs are employed, the IC fixing structure can reliably position the ICs.

Another optional aspect of the present invention provides An Integrated Circuit (IC) fixing structure fixing an IC with no fixing part on a heat dissipation plate using an IC fixing component, comprising: the heat dissipation plate having a rotation limiting hole and a screw hole; the IC fixing component includes a locking case formed by bending a thin steel plate and accommodating the IC so that a side of the IC that is out of a face-to-face contact with the heat dissipation plate is brought into face-to-face contact with a locking case so as to be covered; and a fixing part extending from a side surface of the locking case and having a through hole through which a screw member is inserted; and a rotation stop protrusion inserted into the rotation limiting hole, the locking case having a side in face-to-face contact with the IC, said side of the locking case in face-to-face contact with the IC having a lower edge inclined inward; and after the IC has been accommodated in the locking case, the screw member inserted through the through hole is screwed into a screw hole of the heat dissipation plate so that the side of the IC out of face-to-face contact with the locking case is pressed by the lower edge of the locking case thereby to be brought into face-to-face contact with the heat dissipation plate.

BRIEF DESCRIPTION OF THE DRAWINGS

It is to be understood that the drawings are to be used for the purpose of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

DETAILED DESCRIPTION OF THE INVENTION

The detailed description set forth below in connection with the appended drawings is intended as description of presently preferred embodiments of the invention and is not intended to represent the only forms in which the present invention may be constructed and or utilized.

One embodiment of the present invention will be described in the following order:

(1) Construction of IC fixing structure;
(2) Operation and effects of IC fixing structure;
(3) Modified forms; and
(4) Summary 1. Construction of IC Fixing Structure Referring to FIG. 1, an IC fixing structure is provided for fixing an IC 20 with no fixing through holes to a heat dissipation plate 30. The IC fixing structure 40 is constituted by an IC fixing component 10 and a simple processing applied to the heat dissipation plate 30. The IC fixing component 10 positions the IC 20 without use of a screw member. Furthermore, the IC fixing component 10 is screwed to the heat dissipation plate 30 after having positioned the IC 20. Since the IC fixing component reliably positions and brings the IC 20 into a face-to-face contact with the heat dissipation plate 30, the working efficiency can be improved in the case where the IC 20 is fixed to a substrate or the like. Furthermore, heat dissipation of the IC can be improved, and pieces of an IC broken can be prevented from scattering.

Figure 1:
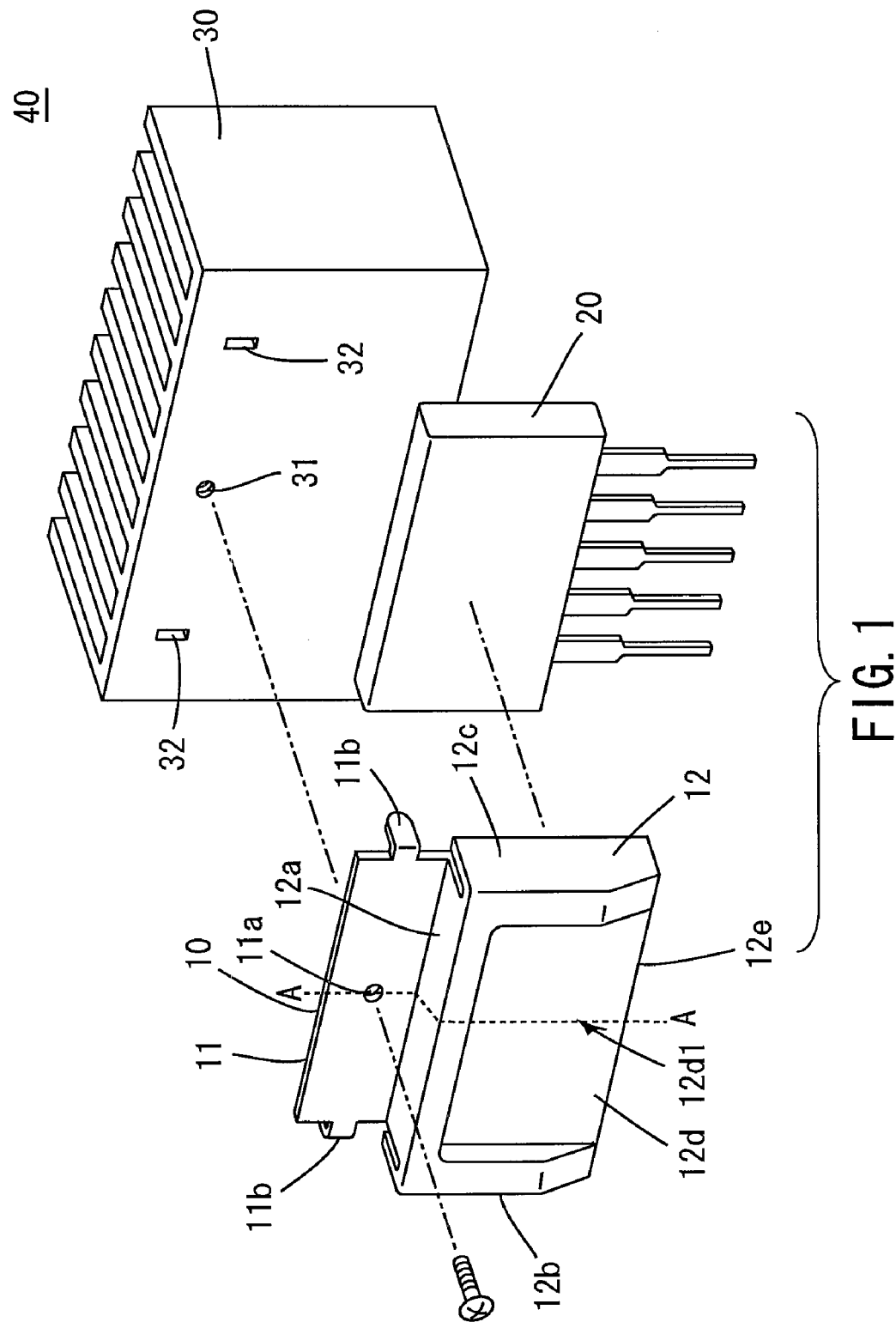
FIG. 1 is a perspective view of one example of the IC fixing structure of the present invention.
Figure 2:
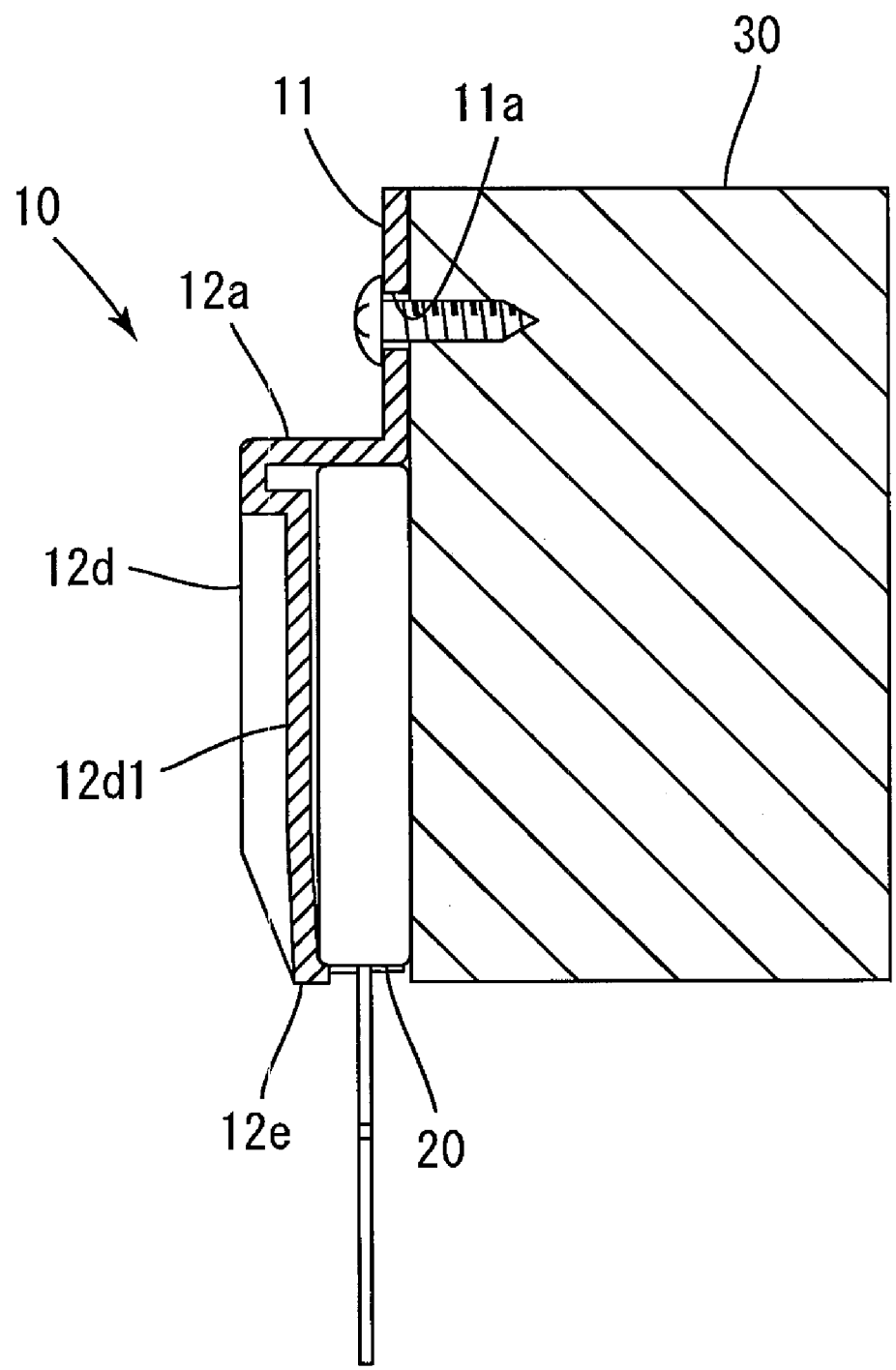
FIG. 2 is a vertical sectional view of the exemplified IC fixing structure.

The IC fixing component 10 is provided for positioning the IC 20 without use of a screw member as shown in FIGS. 1 and 2. For this purpose, the IC fixing component 10 comprises a fixing part 11 and a locking case 12 connected to a lower end of the fixing part 11. The IC fixing component 10 is formed by bending a thin steel plate processed into a predetermined shape. The fixing part 11 includes a through hole 11a and rotation stop protrusions 11b. The through hole 11a is provided for fastening the IC fixing component 10 to the heat dissipation plate 30 with use of a screw member. The rotation stop protrusions 11b are inserted into rotation limiting holes 32 formed in the heat dissipation plate 30 respectively, thereby limiting rotation of the IC fixing component 10. In the embodiment, the rotation stop protrusions 11b are formed by extending and inwardly bending both ends of the fixing part 11. The locking case 12 is provided for positioning and holding the IC 20. For this purpose, the locking case 12 includes an upper opposed face 12a, side opposed faces 12b and 12c, a rear opposed face 12d and an underside opposed face 12e in order to cover the IC 20 except for a side thereof brought into a face-to-face contact with the heat dissipation plate 30. The underside opposed face 12e is shaped so as be out of contact with terminals extending from the IC 20.

The rear opposed face 12d is formed with a step 12d1 protruding inward. The step 12d1 is formed so as to protrude inward relative to the rear opposed face 12d, and the rear opposed face 12d has a lower edge inclined inward. The step 12d1 is formed by pressing or the like.

The IC fixing component 10 which has positioned the IC 20 is screwed to the heat dissipation plate 30. The heat dissipation plate 30 has a screw hole 31 and rotation limiting holes 32. The rotation stop protrusions 11b formed on the fixing part 11 of the IC fixing component 10 are inserted into the rotation limiting holes 32 respectively. In the embodiment, the heat dissipation plate 30 is a heat sink which has the screw hole 31 and is further formed with the rotation limiting holes 32, for example.

2. Operation and Effects of IC Fixing Structure

Figure 3A:
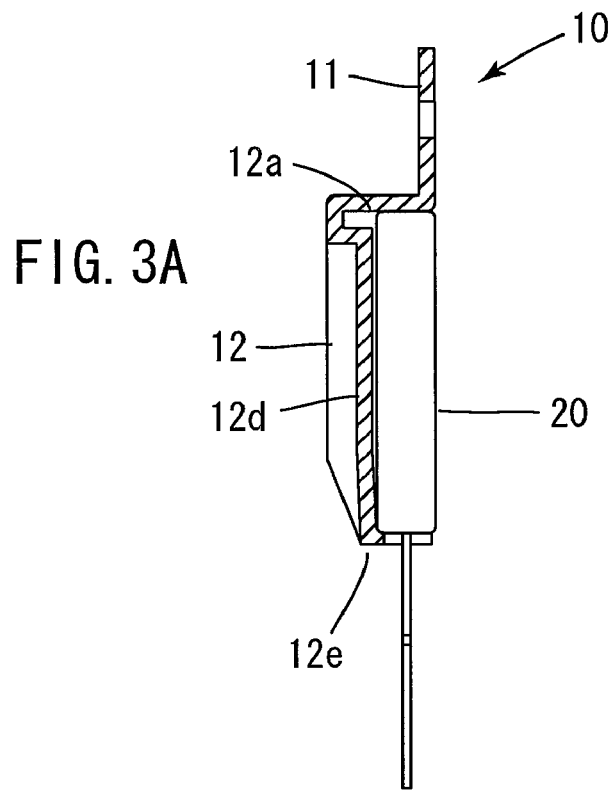
FIGS. 3A and 3B are vertical sectional views of the exemplified IC fixing structure.
Figure 3B:
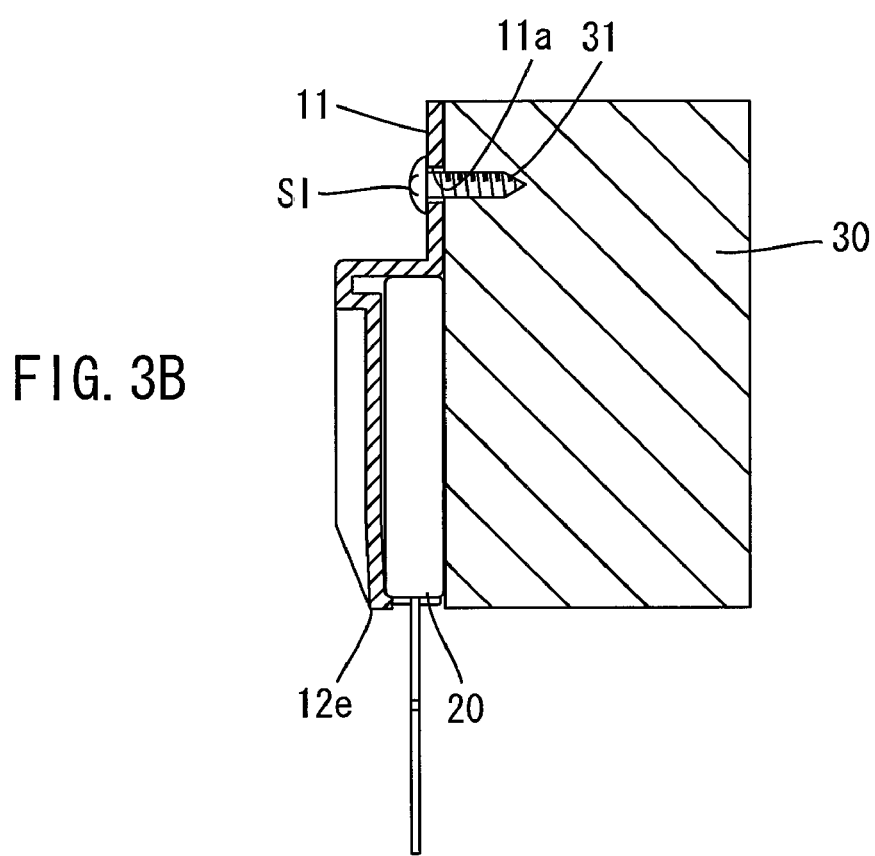

The IC fixing component 10 reliably positions the IC 20 and causes the IC 20 to be brought into a face-to-face contact with the heat dissipation plate 30. As a result, the IC fixing component 10 can improve the working efficiency in the case where the IC 20 is mounted on a substrate or the like. FIGS. 3A and 3B illustrate a manner of mounting an IC on a substrate using the IC fixing structure of the embodiment. Firstly, the IC 20 is accommodated in the locking case 12 of the fixing component 10 as shown in FIG. 3A. As a result, the IC 20 is locked by the upper opposed face 12a, side opposed faces 12b and 12c and underside opposed face 12e of the locking case 12 thereby to be fixed. Subsequently, the rotation stop protrusions 11b of the fixing part 11 are inserted into the rotation limiting holes 32 of the heat dissipation plate 30 respectively. Finally, a screw S1 is inserted through the through hole 11a of the fixing part 11 and then fastened into the screw hole 31 of the heat dissipation plate 30 as shown in FIG. 3B. Consequently, an outer periphery of the IC 20 is locked by the sides of the locking case 12 such that the IC 20 is reliably positioned. Accordingly, the terminals can reliably be inserted into the respective holes of the substrate without movement of the IC 20 in the IC fixing component 10 even when the terminals of the IC 20 are inserted into the respective holes of the substrate with the heat dissipation plate 30 being held by a hand.

Furthermore, heat dissipation of the IC 20 can be improved, and pieces of an IC broken can be prevented from scattering. More specifically, since the rear opposed face 12d of the IC fixing component 10 is formed with the step 12d1, the IC 20 is pressed to the heat dissipation plate 30 side so that the IC 20 is brought into a face-to-face contact with the heat dissipation plate 30. Consequently, heat dissipation of the IC 20 can further be improved. Furthermore, since the locking case 12 locking the IC 20 fixes the IC 20 so as to cover the IC 20 together with the heat dissipation plate 30. Consequently, even when the IC 20 is broken, pieces of the broken IC 20 can be prevented from scattering, whereupon the safety can be improved.

3. Modified Forms

Figure 4:
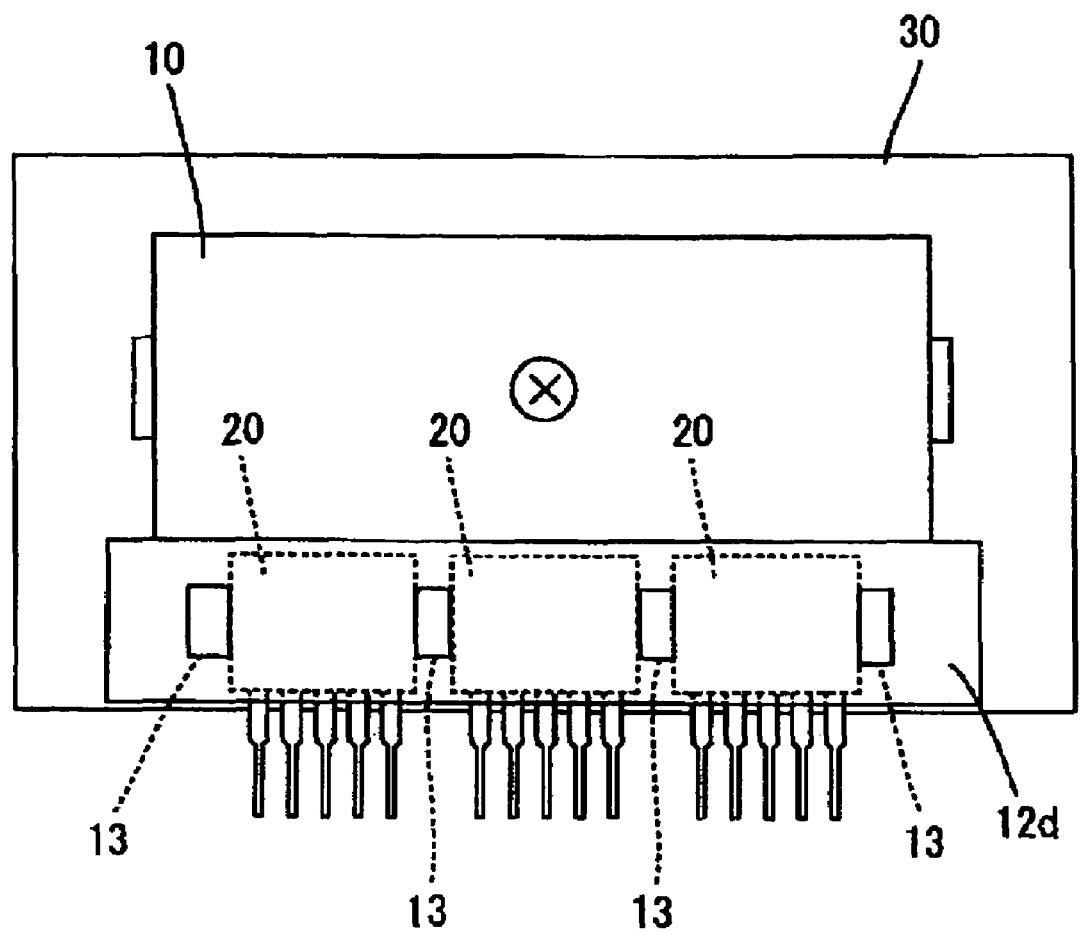
FIG. 4 is a front view of a modified form of the IC fixing structure of the invention.

The IC fixing structure 40 of the foregoing embodiment may be modified as follows. As shown in FIG. 4, a plurality of ICs 20 may be fixed to the IC fixing component 10. In this case, the locking case 12 is formed so that the rear opposed face 12d has a length substantially equal to a width of the IC 20 to be accommodated. Furthermore, the rear opposed face 12d is formed with a cut-and-raised piece 13. In the modified form as shown in FIG. 4, three ICs 20 are juxtaposed, and six cut-and-raised pieces 13 are formed on both ends of the ICs 20. More specifically, generally C-shaped cu-and-raised pieces 13 are formed so as to be opposed to the sides of each IC 20 by bending. As a result, the sides of each IC 20 are brought into a face-to-face contact with the cut-and-raised pieces 13 respectively and are held between the upper and underside opposed faces 12a and 12e. Accordingly, both ends of each IC 20 are locked by the cut-and-raised pieces 13, thereby being reliably locked by the IC fixing component 10.

4. Summary

The IC fixing structure 40 is provided for fixing the IC 20 with no fixing through hole to the heat dissipation plate 30. The IC fixing structure 40 is constituted by the IC fixing component 10 and the simple processing applied to the heat dissipation plate 30. In this case, the IC fixing component 10 positions the IC 20 without use of screws. Furthermore, the IC fixing component 10 which has positioned the IC 20 is fastened to the heat dissipation plate 30 by the screw. Since the IC fixing component 10 reliably positions the IC 20 and brings the IC 20 into a face-to-face contact with the heat dissipation plate 30, the IC fixing component 10 can improve the working efficiency in the case where the IC 20 is fixed to a substrate or the like.

The invention should not be limited by the foregoing embodiment. For those of ordinary skill in the art, it goes without saying that mutually replaceable members or arrangements disclosed in the embodiment can be re-combined in different modes, that members or arrangements which are not disclosed in the embodiment but belong to the related art and which are mutually replaceable with the members or arrangements disclosed in the embodiment can suitably be replaced or re-combined in different modes, and that members or arrangements which are not disclosed in the embodiment but which those of ordinary skill in the art can consider as replaceable with the members or arrangements disclosed in the embodiment can suitably be replaced or re-combined in different modes.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

What is claimed is:

1. An Integrated Circuit (IC) fixing structure fixing an IC on a heat dissipation plate using an IC fixing component, comprising:

the heat dissipation plate having a screw hole, the IC fixing component having a locking case accommodating the IC so that a side of the IC that is out of face-to-face contact with the heat dissipation plate is brought into face-to-face contact with the locking case so to be covered; and a fixing part having a through hole through which a screw member is inserted; and after the IC has been accommodated in the locking case, the IC fixing component is screwed to the screw hole of the heat dissipation plate using the through hole so that the side of the IC out of face-to-face contact with the locking case is pressed by a lower edge of the locking case thereby brought into face-to-face contact with the heat dissipation plate.

2. The structure according to claim 1, wherein the heat dissipation plate comprise a rotation limiting hole, and the fixing part comprise a rotation stop protrusion which is inserted into the rotation limiting hole when screwed to the heat dissipation plate.

3. The structure according to claim 1, wherein the locking case having an inwardly inclined lower edge, and the IC is pressed by the inwardly inclined lower edge of the side of the locking case.

4. An Integrated Circuit (IC) fixing structure fixing an IC on a heat dissipation plate using an IC fixing component, comprising:

the heat dissipation plate having a rotation limiting hole and a screw hole;

the IC fixing component includes a locking case formed by bending a thin steel plate and accommodating the IC so that a side of the IC that is out of a face-to-face contact with the heat dissipation plate is brought into face-to-face contact with a locking case so as to be covered; and a fixing part extending from a side surface of the locking case and having a through hole through which a screw member is inserted; and a rotation stop protrusion inserted into the rotation limiting hole, the locking case having a side in face-to-face contact with the IC, said side of the locking case in face-to-face contact with the IC having a lower edge inclined inward; and after the IC has been accommodated in the locking case, the screw member inserted through the through hole is screwed into a screw hole of the heat dissipation plate so that the side of the IC out of face-to-face contact with the locking case is pressed by the lower edge of the locking case thereby to be brought into face-to-face contact with the heat dissipation plate.

* * * * *